(12) United States Patent
Ruehl et al.

(10) Patent No.: US 8,547,710 B2
(45) Date of Patent: Oct. 1, 2013

(54) ELECTROMAGNETICALLY SHIELDED POWER MODULE

(75) Inventors: James Nicholas Ruehl, Excelsior, MN (US); Wallace Jensen, Centerville, MN (US); Greg Fuchs, River Falls, WI (US); Gale Nordling, Excelsior, MN (US); George Anderson, Champlin, MN (US)

(73) Assignee: Emprimus, LLC, St. Louis Park, MN (US)

(*) Notice: Subject to any disclaimer, the term of this patent is extended or adjusted under 35 U.S.C. 154(b) by 283 days.

(21) Appl. No.: 13/004,693

(22) Filed: Jan. 11, 2011

(65) Prior Publication Data

US 2011/0222249 A1    Sep. 15, 2011

Related U.S. Application Data

(63) Continuation-in-part of application No. 12/906,875, filed on Oct. 18, 2010.

(60) Provisional application No. 61/293,981, filed on Jan. 11, 2010, provisional application No. 61/252,534, filed on Oct. 16, 2009, provisional application No. 61/330,820, filed on May 3, 2010.

(51) Int. Cl.
*H05K 9/00*    (2006.01)

(52) U.S. Cl.
USPC .......................................... 361/816; 361/818

(58) Field of Classification Search
USPC ................. 361/728–730, 752, 790, 799, 796, 361/800, 816, 818, 825–826
See application file for complete search history.

(56) References Cited

U.S. PATENT DOCUMENTS 3,009,984 A    11/1961    Lindgren
3,075,818 A    1/1963    Fay
3,158,016 A    11/1964    Fay (Continued)

FOREIGN PATENT DOCUMENTS

EP    1 114 423 B1    2/2007
GB    294513    7/1928

OTHER PUBLICATIONS

Military Handbook 235-1B, Electromagnetic (Radiated) Environment Considerations for Design and Procurement of Electrical and Electronic Equipment, Subsystems and Systems, Part 1B, General Guidance, 20 Pages, 1993.

(Continued)

*Primary Examiner* — Hung S Bui
(74) *Attorney, Agent, or Firm* — Merchant & Gould P.C.

(57) ABSTRACT

An electromagnetically shielded power module and data center including such a module are disclosed. In one example, the electromagnetically shielded power module includes an electromagnetically shielded enclosure including a shell and at least one door, the enclosure surrounding and providing electromagnetic shielding for an interior volume. The electromagnetically shielded power module also includes a power delivery control module positioned within the interior volume and configured to monitor filtered power received into the interior volume of the electromagnetically shielded enclosure. The electromagnetically shielded power module further includes a plurality of power distribution units positioned within the interior volume and configured to receive filtered power from the power delivery control module and route power to one or more computing systems. The electromagnetically shielded power module also includes a stored energy system positioned within the interior volume and configured to deliver energy to the power distribution unit upon detection of an interruption of filtered power to the power delivery control module.

22 Claims, 10 Drawing Sheets

(56) References Cited

U.S. PATENT DOCUMENTS

| | | | |
|---|---|---|---|
| 3,189,394 | A | 6/1965 | Fay |
| 3,297,383 | A | 1/1967 | Fay |
| 3,962,550 | A | 6/1976 | Kaiserswerth |
| D245,303 | S | 8/1977 | Gazarek |
| 4,060,709 | A * | 11/1977 | Hanson .................. 219/130.33 |
| 4,066,305 | A | 1/1978 | Gazarek |
| D248,003 | S | 5/1978 | Gazarek |
| 4,102,554 | A | 7/1978 | Reimer |
| 4,115,656 | A | 9/1978 | Aitel |
| 4,177,353 | A | 12/1979 | McCormack |
| 4,655,012 | A | 4/1987 | Downey et al. |
| 4,660,014 | A | 4/1987 | Wenaas et al. |
| 4,677,251 | A | 6/1987 | Merewether |
| 4,691,483 | A | 9/1987 | Anderson |
| 4,748,790 | A | 6/1988 | Frangolacci |
| 4,755,630 | A | 7/1988 | Smith et al. |
| 4,787,181 | A | 11/1988 | Witten et al. |
| D300,097 | S | 3/1989 | Cook |
| 4,894,489 | A | 1/1990 | Takahashi et al. |
| 4,913,476 | A | 4/1990 | Cook |
| 5,045,636 | A | 9/1991 | Johnasen et al. |
| 5,079,388 | A | 1/1992 | Balsells |
| 5,117,066 | A | 5/1992 | Balsells |
| 5,136,453 | A | 8/1992 | Oliver |
| 5,148,111 | A | 9/1992 | Shiloh et al. |
| 5,179,489 | A | 1/1993 | Oliver |
| 5,184,311 | A | 2/1993 | Kraus et al. |
| 5,190,479 | A | 3/1993 | Jordi |
| 5,191,544 | A | 3/1993 | Benck et al. |
| 5,241,132 | A | 8/1993 | McCormack |
| 5,436,786 | A | 7/1995 | Pelly et al. |
| 5,465,534 | A | 11/1995 | Mittag |
| 5,600,290 | A | 2/1997 | Anderson, II |
| 5,751,530 | A | 5/1998 | Pelly et al. |
| 5,828,220 | A | 10/1998 | Carney et al. |
| 5,983,578 | A | 11/1999 | Huttie et al. |
| 6,090,728 | A | 7/2000 | Yenni, Jr. et al. |
| 6,185,065 | B1 | 2/2001 | Hasegawa et al. |
| 6,210,787 | B1 | 4/2001 | Goto et al. |
| 6,292,373 | B1 | 9/2001 | Li et al. |
| 6,320,123 | B1 | 11/2001 | Reimers |
| 6,346,330 | B1 | 2/2002 | Huang et al. |
| 6,380,482 | B1 | 4/2002 | Norte et al. |
| 6,485,595 | B1 | 11/2002 | Yenni, Jr. et al. |
| 6,613,979 | B1 | 9/2003 | Miller et al. |
| 6,838,613 | B2 | 1/2005 | Kopf |
| 6,872,971 | B2 | 3/2005 | Hutchinson et al. |
| 6,891,478 | B2 * | 5/2005 | Gardner .................. 340/635 |
| 7,071,631 | B2 | 7/2006 | Howard, II |
| 7,210,557 | B2 | 5/2007 | Phillips et al. |
| 7,258,574 | B2 | 8/2007 | Barringer et al. |
| 7,418,802 | B2 | 9/2008 | Sarine et al. |
| 7,420,742 | B2 | 9/2008 | Wood et al. |
| 7,475,624 | B1 | 1/2009 | Daily |
| 7,504,590 | B2 | 3/2009 | Ball |
| 7,512,430 | B2 | 3/2009 | Nakamura |
| 7,515,219 | B2 | 4/2009 | Bozzer et al. |
| 7,560,135 | B2 | 7/2009 | Kotsubo et al. |
| 7,576,289 | B2 | 8/2009 | Kessel |
| 7,589,943 | B2 | 9/2009 | Ramirez et al. |
| 7,710,708 | B2 | 5/2010 | Park et al. |
| 7,839,020 | B2 * | 11/2010 | Nakanishi .................. 307/65 |
| 8,183,995 | B2 * | 5/2012 | Wang et al. ................. 340/539.1 |
| 2003/0024172 | A1 | 2/2003 | Lyons et al. |
| 2003/0174487 | A1 | 9/2003 | Garmong |
| 2004/0112205 | A1 | 6/2004 | MacDougall |
| 2004/0232847 | A1 | 11/2004 | Howard, II |
| 2007/0105445 | A1 | 5/2007 | Manto et al. |
| 2007/0127129 | A1 | 6/2007 | Wood et al. |
| 2007/0158914 | A1 | 7/2007 | Tammaro et al. |
| 2008/0050172 | A1 | 2/2008 | Simola et al. |
| 2008/0250726 | A1 | 10/2008 | Slagel et al. |
| 2009/0125316 | A1 | 5/2009 | Moore |
| 2009/0140499 | A1 | 6/2009 | Kline |
| 2009/0229194 | A1 | 9/2009 | Armillas |
| 2009/0278729 | A1 | 11/2009 | Bosser et al. |
| 2009/0291608 | A1 | 11/2009 | Choi et al. |
| 2010/0116542 | A1 | 5/2010 | Sugihara et al. |
| 2010/0208433 | A1 | 8/2010 | Heimann et al. |

OTHER PUBLICATIONS

Military Handbook 237B, Department of Defense Handbook, Guidance for Controlling Electromagnetic Environmental Effects on Platforms, Systems, and Equipment, 248 Pages, 1997.

Military Handbook 253, Guidance for the Design and Test of Systems Protected Against the Effects of Electromagnetic Energy, 27 Pages, 1978.

Military Handbook 273, Survivability Enhancement, Aircraft, Nuclear Weapon Threat, Design and Evaluation Guidelines, 228 Pages, 1983.

Military Handbook 411B, Power and the Environment for Sensitive DoD Electronic Equipment (General), vol. 1, 658 pages, 1990.

Military Handbook 419A, Grounding, Bonding, and Shielding for Electronic Equipments and Facilities, vol. 1 of 2 Volumes, Basic Theory, 812 Pages, 1987.

Military Handbook 1857, Grounding, Bonding and Shielding Design Practices, 185 Pages, 1998.

Military Handbook 5961A, List of Standard Semiconductor Devices, 33 pages, 1999.

Military Standard 188-124B, Grounding, Bonding and Shielding, for Common Long Haul/Tactical Communication Systems Including Ground Based Communications-Electronics Facilities and Equipments, 41 Pages, 1992.

Military Standard 188-125-1, Department of Defense Interface Standard, High-Altitude Electromagnetic Pulse (HEMP) Protection for Ground-Based C41 Facilities Performing Critical, Time-Urgent Missions (Part 1-Fixed Facilities), 107 Pages, 1998.

Military Standard 188-125-2, Department of Defense Interface Standard, High-Altitude Electromagnetic Pulse (HEMP) Protection for Ground-Based C41 Facilities Performing Critical, Time-Urgent Missions (Part 2—Transportable Systems), 148 Pages, 1999.

Military Standard 188-125, High-Altitude Electromagnetic Pulse (HEMP) Protection for Ground-Based C41 Facilities Performing Critical, Time-Urgent Missions (vol. 1—Fixed Facilities), 114 Pages, Feb. 1994.

Military Standard 220C, Department of Defense—Test Method Standard—Method of Insertion Loss Measurement, 19 Pages, 2009.

Military Standard 285—Notice of Cancellation—MIL-STD-285, dated 1956 canceled, 17 Pages, 1997.

Military Standard 285, Military Standard Attenuation Measurements for Enclosures, Electromagnetic Shielding, for Electronic Test Purposes, 15 Pages, 1956.

Military Standard 461C, Electromagnetic Emission and Susceptibility Requirements for the Control of Electromagnetic Interference, 183 Pages, 1986.

Military Standard 461E, Requirements for the Control of Electromagnetic Interference Characteristics of Subsystems and Equipment, 253 Pages, 1999.

Military Standard 461F, Requirements for the Control of Electromagnetic Interference Characteristics of Subsystems and Equipment, 269 Pages, 2007.

Military Standard 462, Electromagnetic Interference Characteristics, 80 Pages, 1967.

Military Standard 462D, Measurement of Electromagnetic Interference Characteristics, 203 Pages, 1993.

Military Standard 464, Electromagnetic Environmental Effects Requirements for Systems, 116 Pages, 1997.

Military Standard 464A, Electromagnetic Environmental Effects Requirements for Systems, 121 pages, 2002.

Military Standard 469B, Radar Engineering Interface Requirements, Electromagnetic Compatibility, 98 Pages, 1996.

Military Standard 1542B (USAF), Electromagnetic Compatibility and Grounding Requirements for Space System Facilities, 52 Pages, 1991.

Specification NSA No. 94-106, National Security Agency Specification for Shielded Enclosures, 9 Pages, 1994.

Military Handbook 1195, Radio Frequency Shielded Enclosures, 86 Pages, Sep. 1988.
IEEE Std 299-1997, IEEE Standard Method for Measuring the Effectiveness of Electromagnetic Shielding Enclosures, 44 Pages, 1997.
Leland H. Hemming, Architectural Electromagnetic Shielding Handbook—A Design Specification Guide, IEEE Press, 232 Pages, 1991.
USAF Handbook for the Design and Construction of HEMP/TEMPEST Shielded Facilities, AF Regional Civil Engineer Central Region, Dallas, Texas, 39 Pages, 1986.
ETS-Lindgren—High Performance EMI/RFI Shielding Solutions, 2 Pages, 2002.
ETS-Lindgren—Double Electrically Isolated Rf Enclosures, for Industrial, Communication, and Research and Development Applications, 8 Pages, 2005.
ETS-Lindgren—Tempest Information Processing System (TIPS), 2 Pages, 2008.
ETS-Lindgren—Table Top Enclosure—5240 Series, 2 Pages, 2009.
NSA-94-106, National Security Agency Specification for Shielded Enclosures, 9 Pages, 1994.
Equipto Electronic Corporation—Technical Guide to EMI/RFI Suppression in Electronic Cabinets, 16 Pages, Apr. 2005.
H. Bloks, "NEMP/EMI Shielding," EMC Technology, vol. 5, No. 6, Nov.-Dec. 1986, 5 Pages.
W.E. Curran, "New Techniques in Shielding," ITEM, 1984, 9 Pages.
W.E. Curran, "Shielding for HEMP/TEMPEST Requirements," ITEM, 1988, 10 Pages.

\* cited by examiner

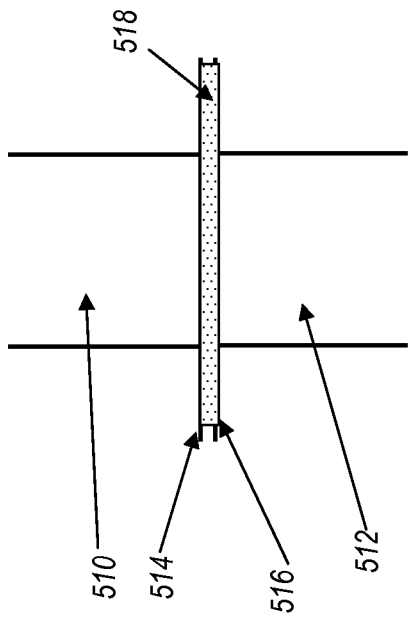
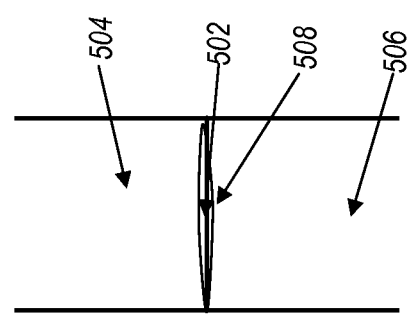
Figure 5B
Figure 5A

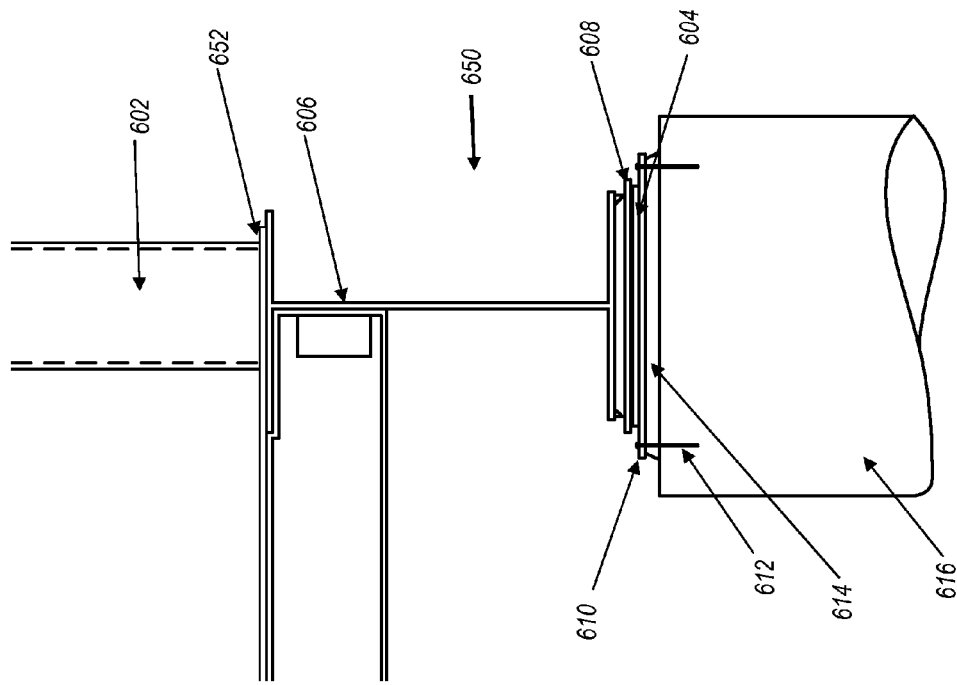
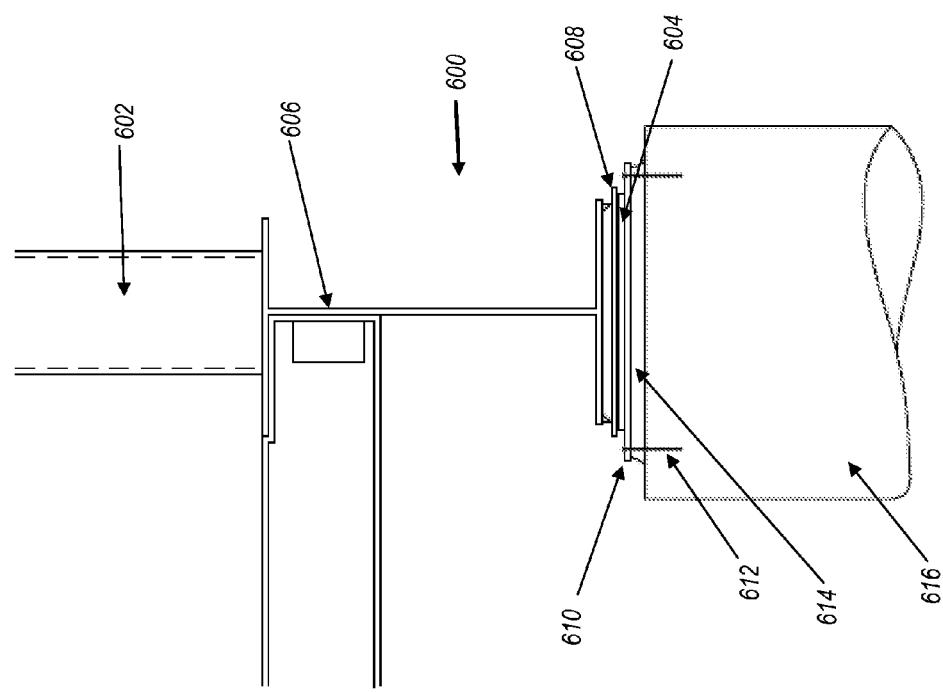

ELECTROMAGNETICALLY SHIELDED POWER MODULE

CROSS REFERENCE TO RELATED APPLICATIONS

This application claims priority from U.S. Provisional Patent Application Ser. No. 61/293,981, filed Jan. 11, 2010, the disclosure of which is hereby incorporated by reference in its entirety.

This application also claims priority from and is a continuation-in-part application to U.S. patent application Ser. No. 12/906,875, filed Oct. 18, 2010, which claims priority from U.S. Provisional Patent Application Ser. No. 61/252,534, filed Oct. 16, 2009; U.S. Provisional Patent Application Ser. No. 61/293,981, filed Jan. 11, 2010; and U.S. Provisional Patent Application 61/330,820, filed May 3, 2010. Each of these applications are hereby incorporated by reference in their entireties.

TECHNICAL FIELD

The present disclosure relates to enclosures providing protection from electromagnetic fields. In particular, the present disclosure relates to an electromagnetically shielded power module, for example for use in a modular data center.

BACKGROUND

The use of highly developed electronics has provided the world with many applications that are integral to operation of financial, medical, electric-utility, and many other industries. The use of electronics is also integral to the operation of supporting infrastructure items such as the power grid, air conditioning, and emergency electricity-generation equipment.

Exposure to electromagnetic fields can cause interference or damage to such electronic equipment, causing that equipment to malfunction or rendering it nonoperational. These electronics are susceptible to being disrupted or damaged by electromagnetic interference, such as an electromagnetic pulse (generally characterized by frequencies between 14 kHz and 1 GHz) or intentional electromagnetic interference (generally characterized by frequencies between 10 MHz and 10 GHz) (EMP/IEMI) event. These electromagnetic events are capable of producing electromagnetic environments of much higher intensity than current electronic equipment is designed to operate in. Environments requiring the shielding of sensitive electronic equipment have not been considered in current standards for protection against electromagnetic interference and protection in these environments requires shielding sensitive electronic equipment in ways that have not been adopted in the industry related to electromagnetic compatibility is required.

Some methods for protecting electronic equipment from electromagnetic pulses are known in the art. For instance, high altitude nuclear electromagnetic pulse (HEMP) hardening has been used by the military for decades, and equipment and standards exists for protecting equipment from this and other electromagnetic threats. Standards are written toward protecting facilities, and physically substantial shielding is used in such construction. Electromagnetic shielding has been previously used to address discrete circumstances. Such examples are magnetic resonance imaging (MRI) rooms, shielding rooms used to test equipment and electromagnetic standards, shielding used in research facilities to protect sensitive equipment from interference. These standards, however, are used to adjust a narrow range of threats and thus systems developed to address a certain problem are not useful to address other problems necessitating electromagnetic shielding. A commoditized, standard electromagnetically shielded enclosure that can be used in several applications is desirable.

It is known in the art that a shield against EMP/IEMI events can be constructed making a solid electromagnetically conductive enclosure (sometimes called a "Faraday cage"). These enclosures lack practical applicability, however, as any attempt to access the interior of the enclosure disrupts the shielding effect and exposes any sensitive equipment housed in the enclosure to a timely EMP/IEMI event. Existing and planned data centers using such enclosures tend to be individually engineered in that the physical layout of the spaces is different from data center to data center. This type of approach leads to high design and construction costs. Moreover, existing methods for protecting sensitive electronics from electromagnetic interference are designed with a narrow range of applicability in mind and do not cover the entire range of potential EMP/IEMI threats. The enclosures of the present disclosure proposed are an engineered system that can be built at remote locations, hauled, and installed at the data center location with relative ease, efficiency, and cost effectiveness. Moreover, the enclosures of the present disclosure provide protection from a wide range of EMP/IEMI threats. Additionally, large-scale data centers typically used to perform operations in a number of industries are not currently designed with these concerns in mind, and are constructed in such a way to make modifications, whether for protection, expansion, or other reasons.

For these and other reasons, improved solutions to EMP/IEMI threats which are cost and time-effective, and scalable, are desirable from a business standpoint.

SUMMARY

In accordance with the following disclosure, the above and other issues are addressed by the following.

In a first aspect, an electromagnetically shielded power module is disclosed. The electromagnetically shielded power module includes an electromagnetically shielded enclosure including a shell and at least one door, the enclosure surrounding and providing electromagnetic shielding for an interior volume. The electromagnetically shielded power module also includes a power delivery control module positioned within the interior volume and configured to monitor a filtered power signal received into the interior volume of the electromagnetically shielded enclosure. The electromagnetically shielded power module further includes a plurality of power distribution units positioned within the interior volume and configured to receive a filtered power signal from the power delivery control module and route power to one or more computing systems. The electromagnetically shielded power module also includes a stored energy system positioned within the interior volume and configured to deliver energy to the power distribution unit upon detection of an interruption of the filtered power signal to the power delivery control module.

In a second aspect, a data center is disclosed. The data center includes a plurality of interconnected electromagnetically shielded modules including at least one power module. The power module includes an electromagnetically shielded enclosure including a shell and at least one door, the enclosure surrounding and providing electromagnetic shielding for an interior volume, and a power delivery control module positioned within the interior volume and configured to monitor a filtered power signal received into the interior volume of the electromagnetically shielded enclosure. The power module further includes a plurality of power distribution units positioned within the interior volume and configured to receive filtered power from the power delivery control module and route power to one or more computing systems. The power module also includes a stored energy system positioned within the interior volume and configured to deliver energy to the power distribution unit upon detection of an interruption of the filtered power to the power delivery control module.

Power modules and data centers built according to the present disclosure provide shielding against electromagnetic shielding across a wide range of frequencies. Moreover, enclosures build according to the present disclosure are easily transported to the site of installation and can be easily arranged to suit the needs of a variety of applications by limiting engineering and construction costs.

BRIEF DESCRIPTION OF THE DRAWINGS

FIG. 5A is an overhead line drawing of a connection between two continuously-welded shells forming a portion of a modular, electromagnetically shielded enclosure;

FIG. 5B is an overhead line drawing of a connection between two continuously-welded shells forming a portion of a modular, electromagnetically shielded enclosure;

FIG. 6A is a perspective view of a support mechanism forming a portion of a modular, electromagnetically shielded enclosure according to a possible embodiment of the present disclosure;

FIG. 6B is a perspective view of a support mechanism forming a portion of a modular, electromagnetically shielded enclosure according to a second possible embodiment of the present disclosure;

DETAILED DESCRIPTION

Figure 1:
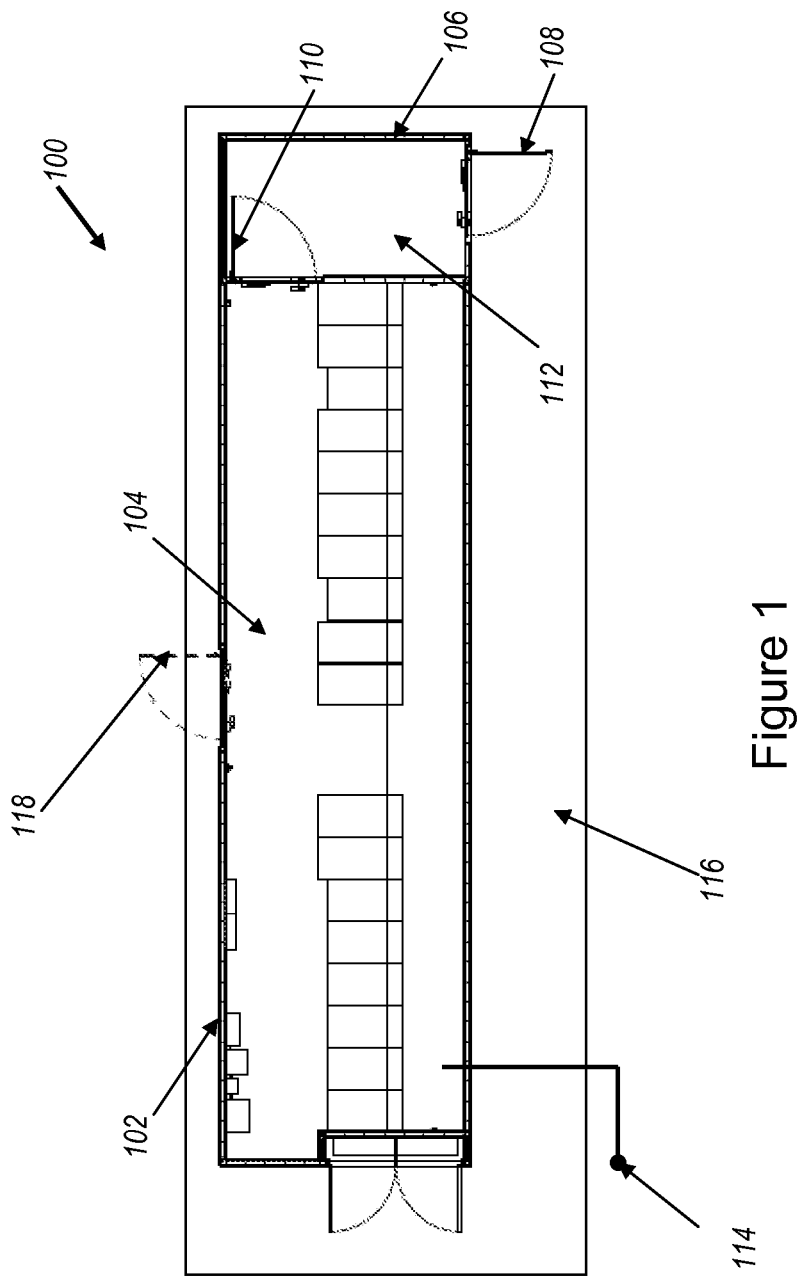
FIG. 1 is an overhead line drawing of an electromagnetically shielded enclosure according to an example embodiment of the present disclosure.

Various embodiments of the present disclosure will be described in detail with reference to the drawings, wherein like reference numerals represent like parts and assemblies throughout several views. Reference to various embodiments does not limit the scope of the disclosure. Additionally, any examples set forth in this specification are not intended to be limiting and merely set forth some of the many possible embodiments for the present disclosure.

In general, the present disclosure relates to an electromagnetically shielded enclosure, and in particular an enclosure shielded against EMP/IEMI events. The electromagnetically shielded enclosures of the present disclosure are configured to specifically protect against signals having a frequency between 14 kHz and 10 GHz, and having high electrical field (e.g., in excess of 100,000 Volts/meter). In certain embodiments of the present disclosure, the electromagnetically shielded enclosure is made from a number of portable units, forming a modular enclosure. Even in such arrangements, connections between individual modules are constructed to retain the electromagnetic shielding of each individual module. An enclosure built according to the present disclosure provides spatially- and temporally-continuous electromagnetic shielding while allowing access to an electronic instruments operating within the enclosure. An enclosure built according to the present disclosure also provides modularity, allowing expansion of the enclosure with relative ease.

In certain aspects of the present disclosure, an electromagnetically shielded power module is discussed which can be used to monitor and manage input power received at a shielded data center and routed to data racks and other equipment in a shielded data center. The power module, according to various embodiments, is designed to both filter input power, as well as to supplement a power supply for a limited amount of time if power delivery to the data center is interrupted for any reason, including in the case of EMP/IEMI events.

Referring to FIG. 1, an electromagnetically shielded enclosure 100 is provided. The enclosure includes a shell 102. The shell may take any shape, but must surround an interior volume 104 continuously in all directions. In the embodiment shown in FIG. 2, the shell includes a top 202, a bottom 204, and four side walls 206. Other numbers of sides, or configurations of the enclosure are possible as well. For example, the top 202 can include a pitched roof, or otherwise be altered in shape.

The shell 102 may take any size. In various embodiments, the shell 102 is sized to allow transportation via flatbed truck to a desired location. In one embodiment, the interior volume 104 is sized to receive electronic equipment and allow human entry. In another embodiment, the shell 102 is 12 feet wide, 49 feet long, and 10 feet 6 inches tall. In such an embodiment, the shell (and any module constructed therefrom) can be configured for automotive transport (e.g., by semi trailer).

The shell 102 can be constructed from any electromagnetically conductive materials. In one embodiment, the electromagnetically conductive material is steel plate, for instance ¼-inch thick steel plate. In other embodiments the electromagnetically conductive material may be aluminum, copper, or any other electromagnetically conductive material or combination of materials. Any joints or seams formed at the intersection of two or more pieces of these construction materials must be continuously welded to provide for a complete electromagnetic shield.

The enclosure also includes a sally port 106 that is located at least partially within the shell 102. The sally port includes a first door 108 and a second door 110. The sally port defines a secondary interior volume 112 within the shell 102 and includes an intermediate shielded interior volume sized to allow human entry through one of the first 108 and second 110 doors. To provide continuous electromagnetic shielding, at least one of the first door 108 and second door 110 is closed at all times. Each of the first door 108 and the second door 110 is constructed from electromagnetically conductive materials. In one embodiment, the electromagnetically conductive material is steel, but alternative materials, such as aluminum, copper, or any other electromagnetically conductive material or combination of any such materials, may be used. Doors appropriate for use in an electromagnetically shielded enclosure as described are commercially available.

The enclosure must be suitably grounded. In one embodiment, the enclosure is grounded at a single point. In another embodiment, the enclosure is grounded at multiple points. All points of grounding 114 must be electrically connected to the shell 102. In order to ensure that the enclosure remains grounded at desired points, the shell 102 must be separated from the ground by a non-electromagnetically conductive spacer 116. In one embodiment, the spacer may be a neoprene pad, but other appropriate spacers may be used. In one embodiment, the spacer 116 is a flexible pad that allows physical movement related to expansion and contraction caused by temperature changes found in some climates. In one embodiment, the spacer 116 also permits anchoring of the modules in a manner that prevents compromise of the desired points of ground by use of conductive fasteners.

The enclosure may include an emergency exit 118 that, in certain embodiments, can be constructed of the same materials as the doors of the sally port 106 described above. When closed, the emergency exit 118 will provide continuous electromagnetic shielding, but shielding will be disrupted when the emergency exit is opened.

Figure 2:
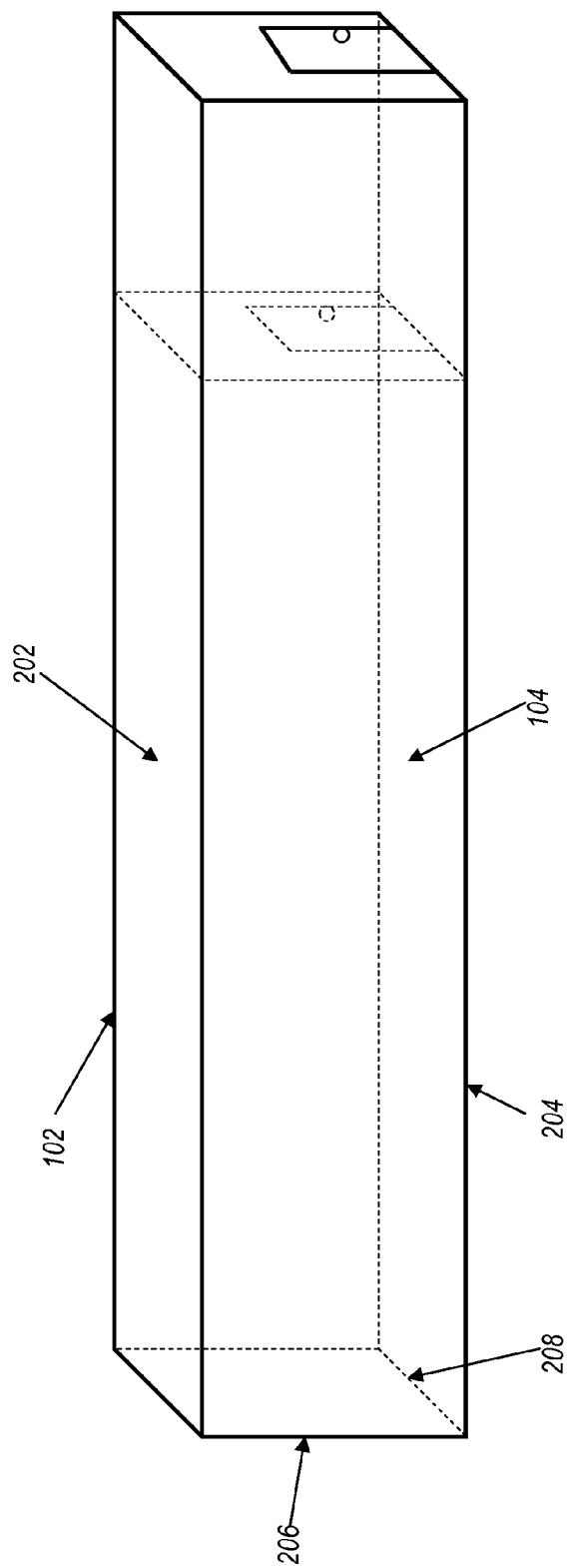
FIG. 2 is a perspective view of the electromagnetically shielded enclosure shown in FIG. 1.

In one embodiment, as shown in FIG. 2, the shell 102 includes a top 202, a bottom 204, and a plurality of side walls 206 enclosing interior volume 104. In this embodiment, each seam 208 joining the side walls 206, the top 202, and the bottom 206 must be continuously welded to ensure complete electromagnetic shielding.

The electromagnetically shielded enclosure described above may be constructed by providing a top, bottom, and plurality of side walls as described above and positioning these elements to form a shell with an interior volume. The seams formed between the top, bottom, and plurality of side walls must be continuously welded along their entire lengths to ensure proper electromagnetic shielding. A sally port can be incorporated into the enclosure by providing a two-door sally port as described above and positioning the sally port so that one door allows access to the interior volume of the shell. The enclosure must then be grounded by providing at least one point of grounding electrically connecting the shell to the reference ground.

Figure 3:
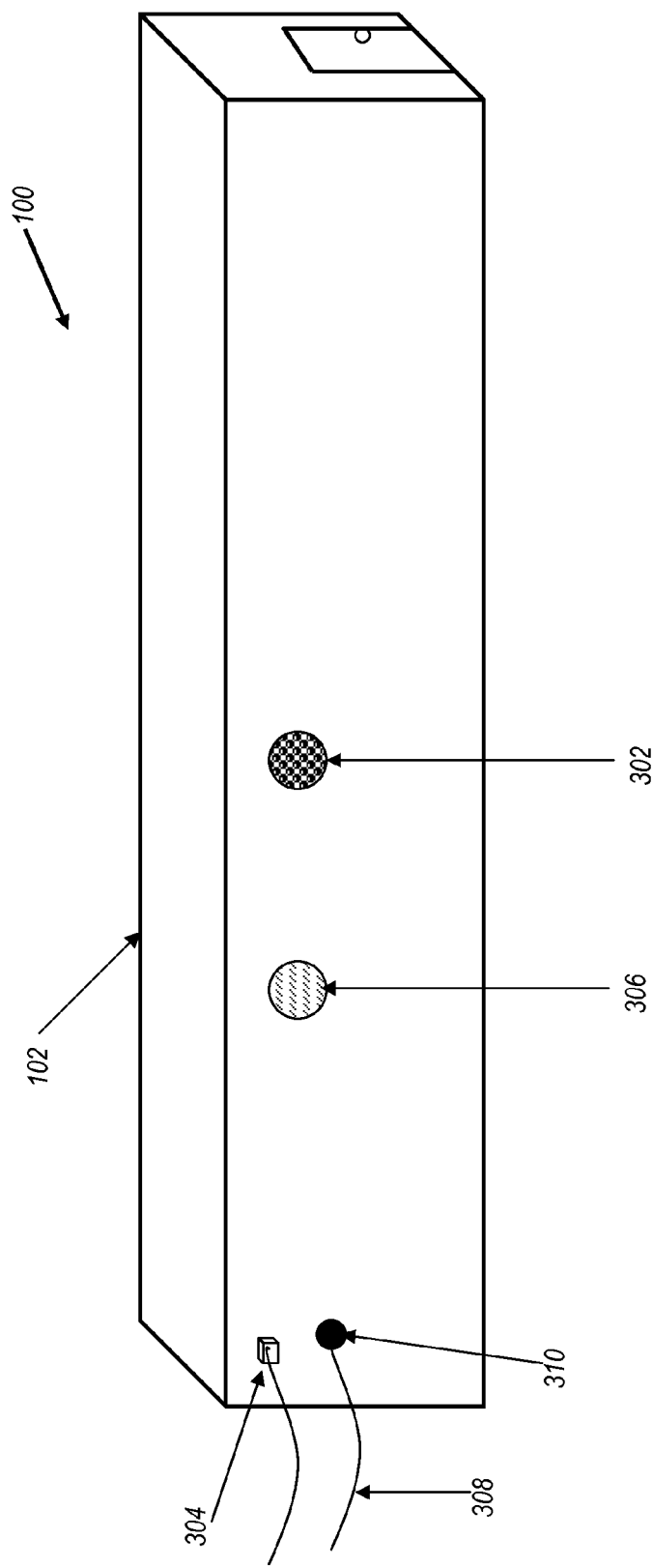
FIG. 3 is a perspective view of the electromagnetically shielded enclosure shown in FIG. 1.

Resources such as air, electricity, water, and electronic communications may be imported into or exported out of the enclosure. Referring now to FIG. 3, air exchange into and out of the enclosure 100 by providing an electromagnetically shielded vent 302 that penetrates shell 102. In one embodiment the seams between the shell 102 and the shielded vent 302 are continuously welded to ensure continuous protection. In another embodiment, mechanical attachment of vent 302 to the shell 102 and the use of an electromagnetically conductive gasket are disclosed. In one embodiment the vent 302 can include an opening that is guarded using any appropriate waveguide beyond cutoff that will sufficiently shield against EMP/IEMI threats. In another embodiment the vent includes a waveguide beyond cutoff configured to filter electromagnetic frequencies between approximately 14 kHz and 10 GHz. In yet another embodiment the vent 302 includes a waveguide beyond cutoff with individual cells having a diameter of 1 inch or smaller configured for a cutoff frequency of 10 GHz with minimum attenuation of 80 dB at this frequency. In one embodiment the dimensions of the waveguides include a cell diameter of 1/8 inch and a thickness of 1 inch.

Electricity may also be imported into the enclosure 100 through use of an appropriate electrical power filter 304 extending from external to the electromagnetic shielded enclosure 100 into the interior volume. The electrical power filter 304 may then be used to deliver power to electronic equipment held within the interior volume. Protection against power surges such as those caused by EMP or IEMI may be provided by the power filter 304. A number of commercially-available power filters may be used. In one embodiment, the power filter 304 is configured to filter electromagnetic signals carried on the electrical conductor between approximately 14 kHz and 10 GHz. In one embodiment, the seams between the shell 102 and the power filter 104 are continuously welded to ensure continuous protection. In another embodiment, mechanical attachment of power filter 304 to the shell 102 and the use of an electromagnetically conductive gasket are disclosed. The seams between the shell 102 and the power filter 304 must be continuously welded or gasketed to ensure continuous protection.

Electronic communications may be imported into the enclosure through use of an appropriate communicative connection 308 extending from external to the electromagnetic shielded enclosure 100 into the interior volume. The communicative connection 308 may, in one embodiment, be a fiber optic cable. To provide sufficient protection against EMP/IEMI events, a fiber-optic cable may be routed through a waveguide beyond cutoff 310. Any suitable fiber-optic waveguide may be used, but in one embodiment the fiber-optic waveguide 310 is configured to filter electromagnetic frequencies below 10 GHz.

In certain embodiments, additional waveguides beyond cutoff can be used to extend through the enclosure, for example to allow entry and exit of other materials, such as air or water (e.g., for cooling and ventilation systems included within the enclosure.

Filtered conductive penetrations may be imported into the enclosure through use of an electrical filter 306. Any acceptable filter 306 may be used. In one embodiment, the filter 306 is configured to filter electromagnetic frequencies between 14 kHz and 10 GHz with 80 dB of attenuation at these frequencies. In one embodiment, the seams between the filter 306 and the shell 102 are continuously welded to ensure continuous protection. In another embodiment, mechanical attachment of filter 306 to the shell 102 and the use of an electromagnetically conductive gasket are disclosed. The seams between the shell 102 and the filter 306 must be continuously welded or gasketed to ensure continuous protection.

In addition to permitting exchange of resources between the interior volume of the enclosure and external, fixtures such as the shielded vent 302, electrical conduit 304, and communicative connection 308 may be configured to connect the shielded enclosure 100 to another shielded enclosure. Such configuration permits practical expansion of the total electromagnetically-shielded interior volume without compromising protection against EMP/IEMI events.

Figure 4A:
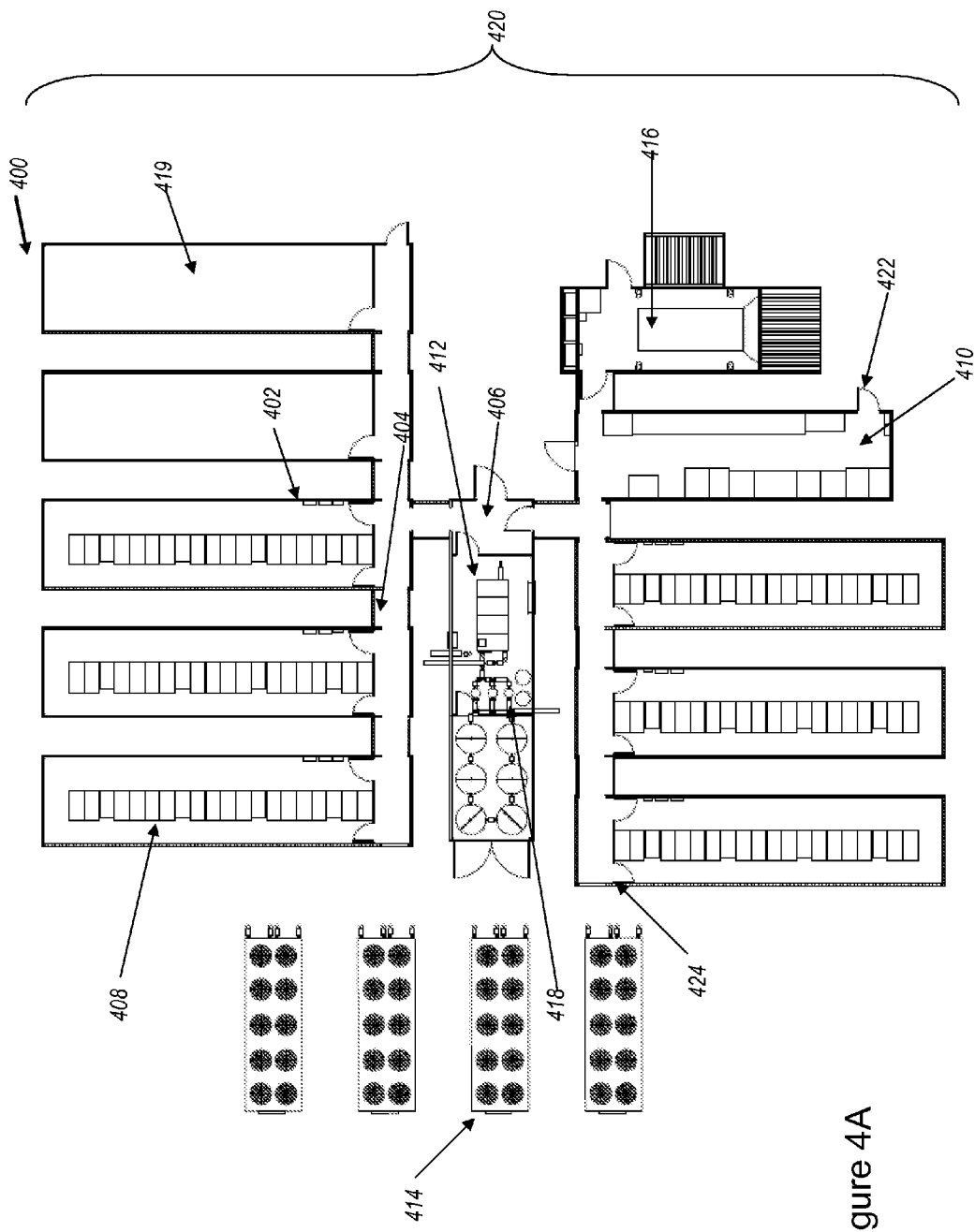
FIG. 4A is an overhead line drawing of a modular, electromagnetically shielded enclosure according to an example embodiment of the present disclosure.
Figure 4B:
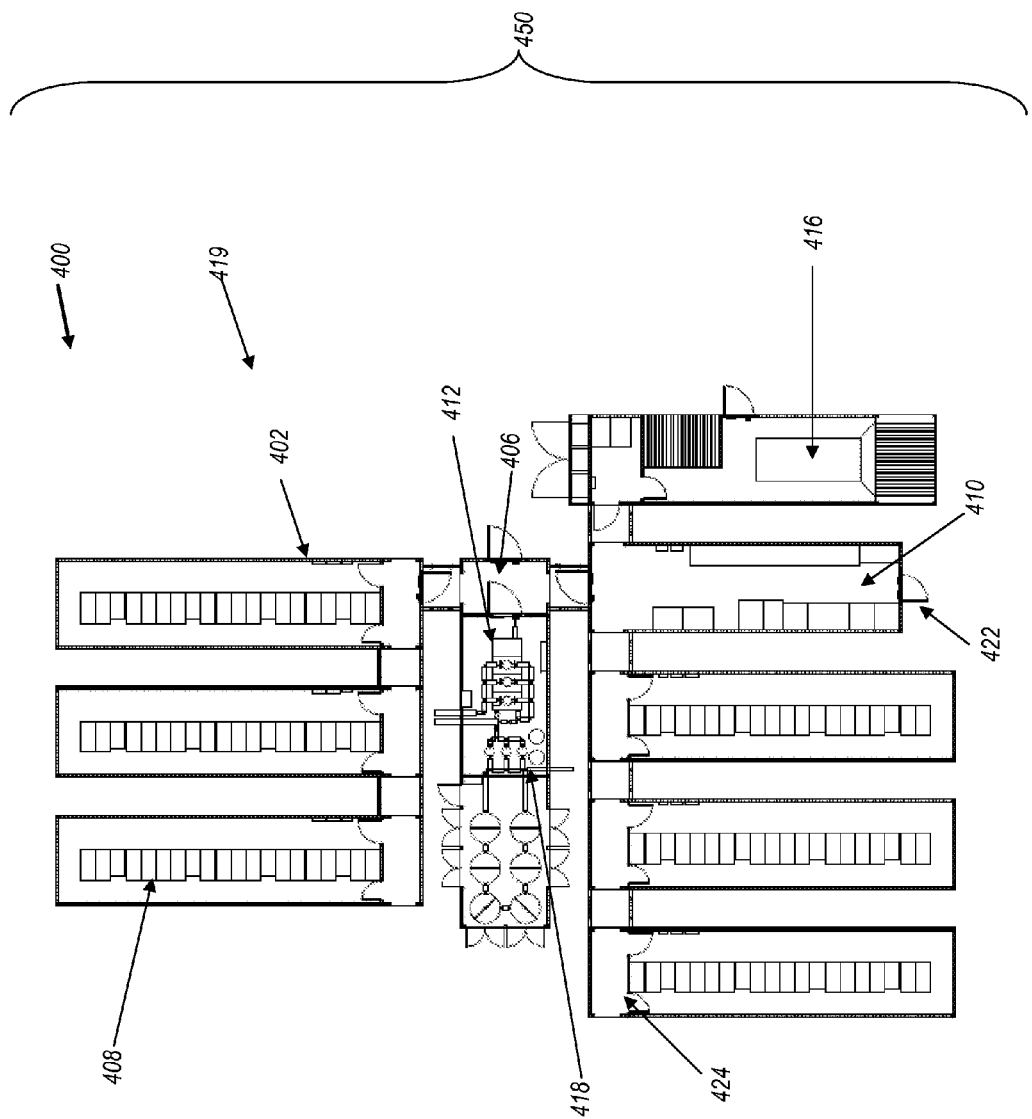
FIG. 4B is an overhead line drawing of a modular, electromagnetically shielded enclosure according to a second example embodiment of the present disclosure.

The present disclosure also contemplates a modular, electromagnetically shielded enclosure that may be used to form an electromagnetically shielded data center. Examples of such a modular enclosure for a data center are illustrated in FIGS. 4A and 4B. Referring now to FIG. 4A, such a modular, electromagnetically shielded enclosure 400 is shown. The modular enclosure 400 is made up of a plurality of continuously-welded shells 402 constructed as described above. Each shell 402 is self-contained but interconnected with at least one other shell.

The connections 404 between each of the shells are each constructed from electromagnetically conductive materials. In one embodiment these connections are constructed from steel, but other conductive materials, such as aluminum, copper, and any other electromagnetically conductive material may be used. The shells 402 are joined with connections 404 that are electromagnetically conductive and continuous. In one embodiment the connection 404 between the modules is a continuously-welded common corridor that provides access to each of the shells 402 and permits the transport of resources between each of the shells 402. In another embodiment the connection 404 is a continuously welded conduit providing only for the exchange of resources. In one embodiment, the connection 404 is located at one end of each shell 402, but other configurations are possible. For instance, a common connection 404 may run through the middle of multiple shells 402.

As presently described, the modular enclosure 400 includes at least one sally port 406 located at least partially within one of the plurality of continuously welded shells 402. The sally port is constructed as described above and is constructed from electromagnetically conductive materials. In one embodiment, the sally port is constructed from steel, but other conductive materials, such as aluminum and copper may be used.

A variety of electronic equipment may be housed within the modular, electromagnetically shielded enclosure 400. For instance computing equipment 408 may be housed within the interior volume of any of the continuously welded shells 402. In one embodiment, power delivery equipment 410 may be operated within the interior volume of at least one of the plurality of shells 402. The power delivery equipment 410 may be configured to deliver power to the computing equipment 408. Any acceptable power delivery equipment 410 may be used. In another embodiment, cooling equipment 412 may be operated at least partially within the interior volume of at least one of the plurality of shells 402. The cooling equipment 412 may be configured to circulate cooled fluid throughout the interior volumes of each of the plurality of shells 402. Any acceptable cooling equipment 412 may be used. Other equipment, such as an electrical generator 416 and/or sensitive instruments, may be housed in interior volume of one of the shells 402. Additionally, some equipment can be located externally to the modular enclosure, such as dry coolers 414, which can be used to cool water or other liquid used in the cooling equipment 412.

A modular enclosure 400 like that shown in FIG. 4A may also include support shells 419 dedicated to support the equipment operating within other shells. In one embodiment, these support shells 419 are used as living quarters, but other uses are contemplated. In another embodiment, the modular system is constructed so that individual users have access only to specific shells, for instance through secured doors, for increased security or separation of computer equipment.

In embodiments of an electromagnetically shielded enclosure including more than one shell (e.g., enclosure 400), different shells can be used to house different categories of electronic equipment. For example, in certain embodiments, one shell could have its interior volume dedicated to storage of computing equipment 408, while a second shell could have its interior volume dedicated to power delivery equipment 410. In still further embodiments, including single-shell embodiments, such as that shown in FIGS. 1 through 3, a mixed set of types of electronic equipment could be included within a single shell, forming a complete data center within a single shell.

Although in the embodiment shown a particular layout of computing equipment 408, power delivery equipment 410, and cooling equipment 412 is illustrated, it is recognized that other arrangements are possible as well. For example in certain arrangements, a number of modules including computing equipment can be included in shells 402 that are separable by access doors 424. The access doors can be electromagnetically shielded in the same manner as the doors 108, 110 of the sally port, but also can include either key-based or keycard-based access controls, such that only certain individuals having access to the interior of the enclosure 400 can in fact access that equipment. This may be useful, for example, in a collocation facility in which different corporate entities or interests have separate sets of computing resources at the same facility, but due to security concerns or other data concerns those entities should not have physical access to other companies' dedicated computing equipment.

Additionally, one or more sensors can be included in or near one or more of the shells of a particular enclosure. For example, in various embodiments, the sensors can include environmental detectors 418, such as electrical field detectors, thermostats, barometers, humidity, carbon monoxide, carbon dioxide, and smoke detectors may also be housed within the interior volume of at least one of the shells 402. In such embodiments, the sensors can be communicatively interconnected, and can be configured to communicate sensed values to a remote location, to allow remote or centralized monitoring of conditions at different points within or external to the shells 402.

Constructed in this manner, the modular, the electromagnetically shielded enclosure can form a modular data center 420, in which various computing equipment can be located on one or more such arranged shells.

Should they be required, the modular enclosure may also include one or more emergency exists 422 that are not part of a sally port. These emergency exits 422 are constructed of electromagnetically conductive materials, such as steel, but opening these exits will disrupt electromagnetic shielding.

Referring now to FIG. 4B, a second modular shielded data center 450 is shown. In this embodiment, the data center 450 also includes computing equipment 408, power delivery equipment 410, and cooling equipment 412. However, locations of access doors 424, emergency exits 422, and other equipment within modules varies somewhat. Although in this embodiment support shells 419 are not shown, inclusion of such modules is possible as an optional configuration.

It is noted that in the data centers of FIGS. 4A-4B, the various shells 402 are shown as integrated to form an overall shielded interior volume protected from electromagnetic events. It is further noted that the shells 402 are placed in a spaced apart configuration, such that the exterior of each shell can be manually inspected by an individual walking along an exterior perimeter of the data centers 420, 450, for example to determine whether the continuous welds along a shell perimeter have been compromised.

In a modular enclosure as describe above, physical connection between individual shells may be accomplished in a variety of ways. In one embodiment, shown in FIG. 5A, the seam 502 between a first shell 504 and a second shell 506 may be joined by a continuous weld 508. In another embodiment, shown in FIG. 5B, a first shell 510 and a second shell 512 may be joined in a flange and gasket system such that a first flange 514, forming a portion of the first shell 510, is connected to a second flange 516, forming a portion of the second shell 512. An electromagnetically conductive gasket 518 is disposed between the flanges 514 and 516. The first flange 514 and the second flange 516 may be joined by mechanical means or continuous welding.

Each shell of the shielded enclosure described above may be secured by a support mechanism 600 in a fashion that enables movement of the shells independently and ensures the enclosures stay grounded at only desired points. In one embodiment, shown in FIG. 6A, the shell 602 sits upon a nonconductive pad 604, such as a neoprene pad. In another embodiment, the shell 602 sits directly on a beam 606. The beam 606 is, in turn, supported by a plate 608. In one embodiment the plate 608 is a 10-gauge stainless steel plate with a length and width of 8 inches. The plate 608 rests upon a nonconductive pad 604. In one embodiment the nonconductive pad 604 is a neoprene/fiber pad with a typical length and width of 7 inches and a thickness of ¾ inch. The nonconductive pad 604 rests upon a bearing pate 610. In one embodiment the bearing plate 610 is an 8 inch by 12 inch, 10-gauge stainless steel plate, but other plates may be used. The bearing plate rests upon a layer of grout 614. The grout rests upon a drilled pier 616. In one embodiment the pier is a 16 inch drilled pier, but other piers may be used. The plate 608, nonconductive pad 604, bearing plate 610, and grout 614 are secured to the pier by a plurality of screw anchors 612. In one embodiment the screw anchors 612 are ½ inch diameter stainless steel screw anchors.

In an alternative embodiment shown in FIG. 6B, the shell 602 includes a floor 652, which rests on a top of the beam 606. In this arrangement, the shell 602, floor 652, and "I" portion of the beam 606 extend beyond one another by a relatively small length (e.g., approximately ¼ inch). In such an arrangement, continuous welds can be located at both (1) the exterior junction between the shell 602 and the floor 652, and (2) the exterior overlapping junction between the floor 652 and a top "I" portion of the beam 606. By placing continuous welds at this location, these welds can be readily visually inspected by an individual walking along the exterior perimeter of the shell 602.

Figure 7:
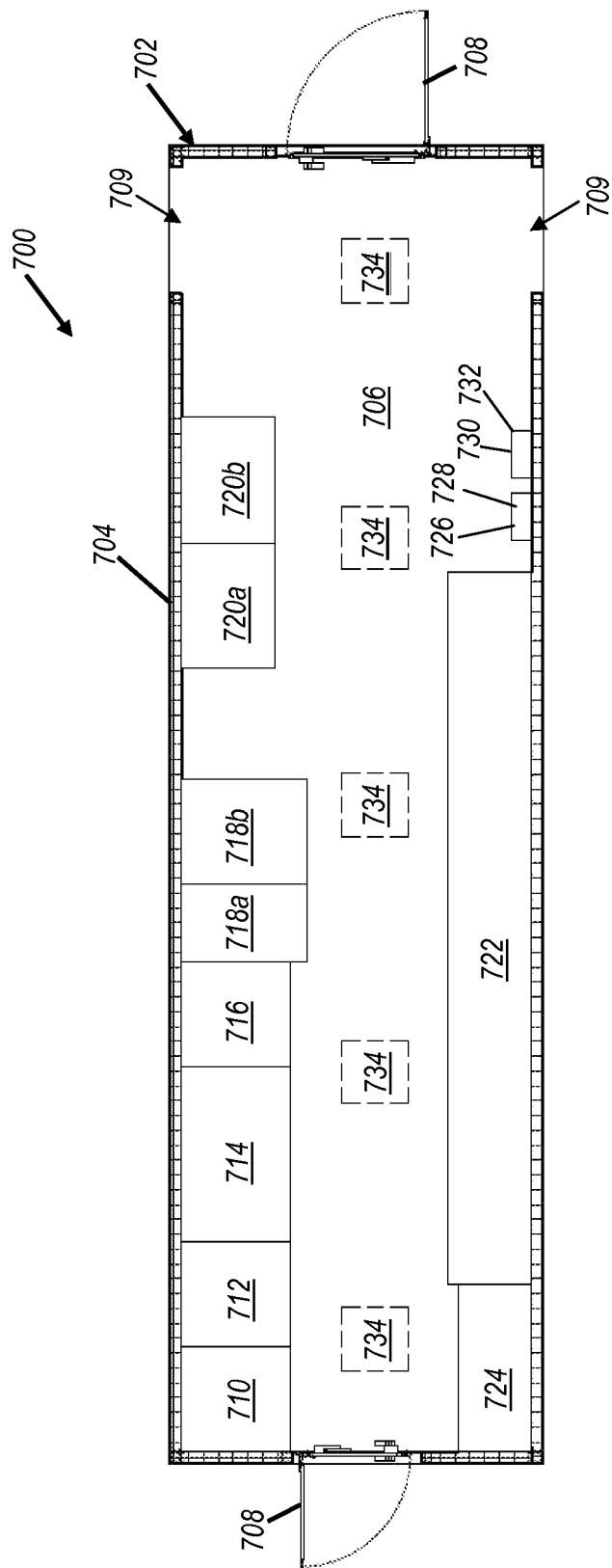
FIG. 7 is a top plan view of an electromagnetically shielded power module, according to a possible embodiment of the present disclosure.
Figure 8:
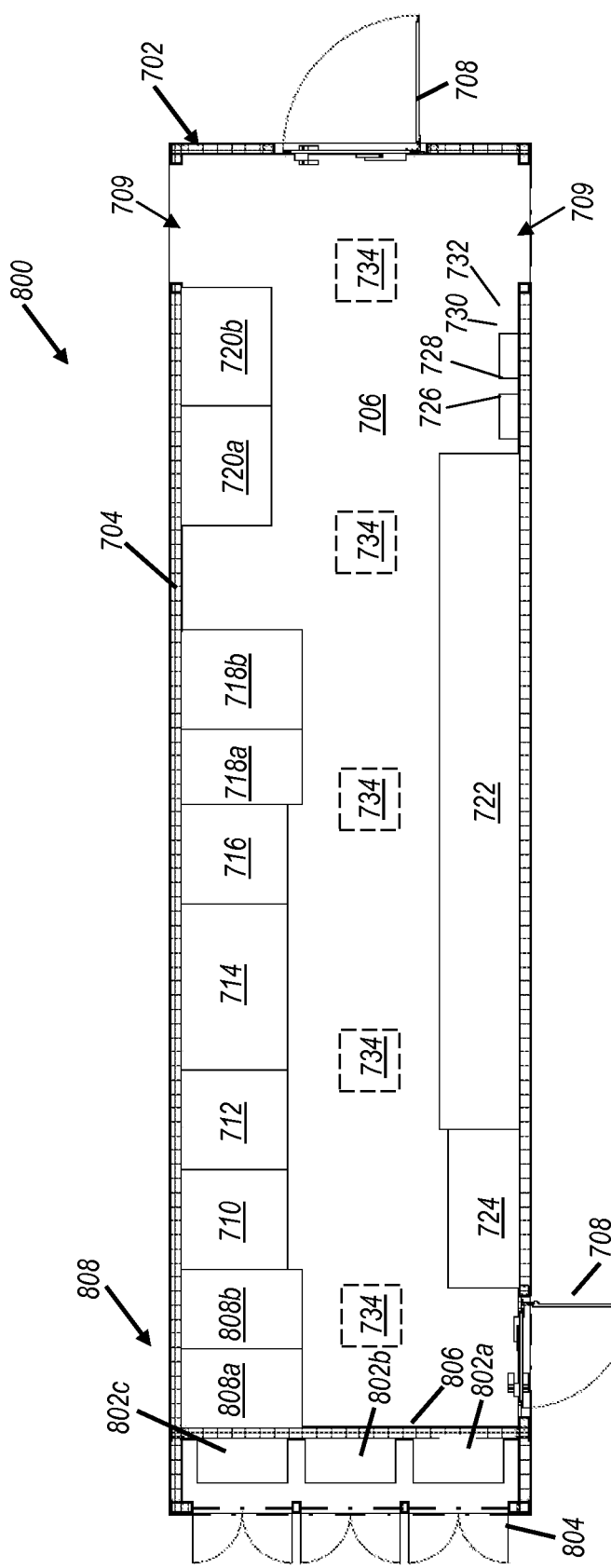
FIG. 8 is a top plan view of an electromagnetically shielded power module, according to a second possible embodiment of the present disclosure.
Figure 9:
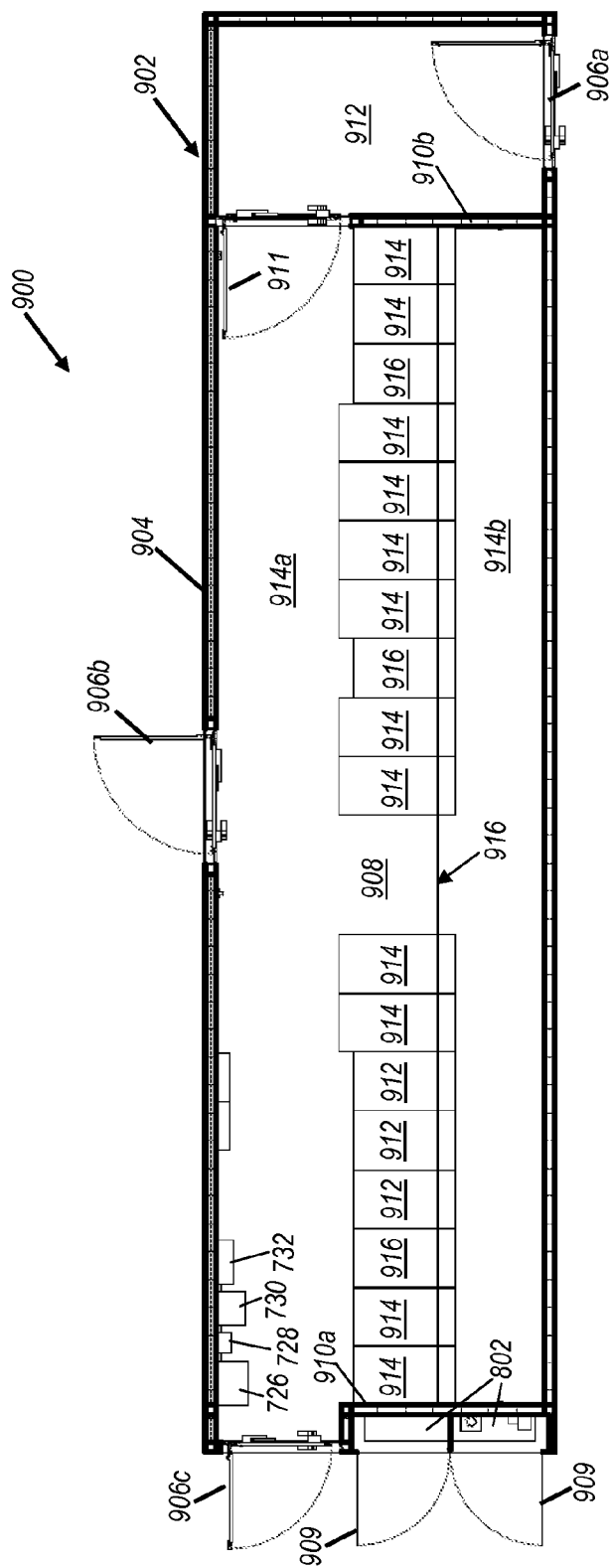
FIG. 9 is a top plan view of an electromagnetically shielded power module, according to a further possible embodiment of the present disclosure.

Referring now to FIGS. 7-9, example embodiments of electromagnetically shielded power modules are disclosed. In general, the power modules of FIGS. 7-9 are configured to provide filtration and monitoring of input power from a power utility or generator, as well as to supplement that power supply for a limited amount of time if power delivery to the data center is interrupted for any reason, including in the case of EMP/IEMI events. These electromagnetically shielded power modules can be used, for example, within modular electromagnetically shielded systems, such as the data center arrangement discussed above in connection with FIGS. 4A-4B.

In the embodiment of FIG. 7, an electromagnetically shielded power module 700 includes an enclosure 702 surrounding power delivery equipment, such as the power delivery equipment 410 of FIGS. 4A-4B. The enclosure 702 includes a shell 704 defining an interior volume 706 in which the equipment is stored. As with the shell 102 described above, the shell 704 is generally rectangular, including four sides, a bottom and a top. Other numbers of sides, or configurations of the enclosure are possible as well. For example, the top can include a pitched roof, or otherwise be altered in shape. Furthermore, the shell 704 is sized to allow transportation via flatbed truck to a desired location. In one embodiment, the interior volume 706 is sized to receive electronic equipment and allow human entry. In another embodiment, the shell 704 is 12 feet wide, 49 feet long, and 10 feet 6 inches tall. Other sizes of shells could be used as well; typically, smaller shells will lend themselves toward greater ease of transport.

The enclosure 702 further includes one or more doors 708 designed to allow human entry into the interior volume for monitoring and maintenance of the power receipt, routing, and distribution equipment. In the embodiment shown, first and second doors 708 are located on opposite ends of the enclosure 702. In certain embodiments, the doors can cooperate with the shell 704 to provide a fully-enclosed, electromagnetically shielded interior volume 706 protected from EMP/IEMI events.

The enclosure 702, formed by the shell 704 and cooperating doors 708 (when closed) provides a continuous electromagnetic shield against incursion of electromagnetic signals in a range of approximately 14 kHz to approximately 10 GHz. In some embodiments, one or more of the doors 708 also includes a weather-resistant gasket used to protect against incursion of moisture, dirt, or other external items from the equipment within the enclosure 702. In certain embodiments, the gasket can provide an EPDM weather seal separating the module 700 from either an external environment, or a security vestibule (e.g., a sally port as described above). One example door useable in forming the enclosure 702 is a hinged leaf door provided by Universal Shielding Corp. of Deer Park, N.J. Other door types could be used as well.

In certain embodiments, such as those where the module 700 is intended for interconnection within a larger data center, the module 700 can include openings designed to form passageways between modules when connected. In the embodiment shown, the module 700 includes a plurality of passageway openings 709 located at one end of the enclosure 702. When the module 700 is interconnected with other modules containing computing equipment, power equipment, cooling equipment, or other systems, the passageway openings 709 can cooperate with openings in other modules to form a passageway, as shown in FIGS. 4A-4B. It is recognized that, when installed, the module 700 will retain continuous shielding of the interior volume 706 due to cooperation with other shielded modules. In some embodiments, the passageway openings can optionally be formed including doors, such that the power module 700 need not immediately be interconnected with other modules, but instead can be used as part of a stand-alone system or could be connected on one side (but not both sides) to another module. In still other embodiments, protected vestibules could be connected at any of the doors 708 or passageway openings 709. In some further embodiments, the doors 708 can be protected by a security access card, key, or other lock-control mechanism, to allow only authorized personnel to access the power module. This could include all authorized users of a particular data center facility or installation, or in other embodiments, could include only facility maintenance personnel and not collocated client users of the facility or installation.

The power delivery equipment can include a variety of types of equipment, depending upon the particular intended use of the electromagnetically shielded power module 700. In the embodiment shown, the electromagnetically shielded power module 700 is generally intended to be used in connection with another shielded enclosure containing data and/or power generation. As such, it is assumed that the electromagnetically shielded power module 700 receives power from a filtered, monitored power source. Consequently, in the embodiment shown, the power receipt, routing, and distribution equipment includes a power delivery control module. In certain embodiments, the power delivery control module can include a uninterruptable power supply ("UPS"), which includes an input/output component 710 positioned proximate to a UPS control module 712 and an inverter 714. The input/output component 710 sends and receives electrical power from the electromagnetically shielded power module 700. The UPS control module 712 detects power received at the input/output component 710, and controls whether to output power received at the input/output component 710 or whether to deliver power from battery systems within the electromagnetically shielded power module 700 (e.g., in case of failure of a utility or generator providing the input power). The inverter 714 converts the received alternating current power to direct current power, and outputs that power for charging a battery subsystem, as further described below. Additionally, a static switch 716 also receives AC power, and acts to clear faults received on the power line. In certain embodiments, the input/output component 710, UPS control module 712, and inverter 714 (and optionally static switch 716) can be part of an integrated UPS system, for example a Symmetra Megawatt II system from American Power Conversion Corp. of Kingston, R.I. Other types of UPS systems can be used as well.

A plurality of bypass switches 718*a-b* (collectively referred to as bypass switches 718) are configured to switch between receiving power passed through the UPS components (i.e., the input/output component 710, UPS control module 712, inverter 714, and static switch 716) and receiving power directly from a power source. The bypass switches 718 provide redundant power connections to a plurality of power distribution units 720*a-b* (collectively referred to as power distribution units 720), which can include a number of power connections and transformer used to condition the received power signal (e.g., converting a 480V filtered power signal to a standards 120 V power signal useable by computing systems), and to route power connections to equipment needing power (e.g., data equipment within a separate module). Example bypass switches useable within the electromagnetically shielded power module include the Symmetra MW Battery Disconnect (e.g., Model No. QMDE2741) from American Power Conversion Corp. of Kingston, R.I. One example power distribution unit useable in the electromagnetically shielded power module 700 is the Wavestar Powerhub PDU from Power Distribution, Inc. of Richmond, Va. Other types of bypass switches and power distribution units can be used as well. It is noted that, in the embodiment shown, additional space is reserved between the bypass switches 718*a-b* and the power distribution units 720*a-b*, to allow for side access to the bypass switches and power distribution units. Although this space may vary, in certain embodiments the space can be approximately three feet and six inches wide.

In the embodiment shown, each of the above-described power receipt, routing, and distribution equipment is located along one side wall of the enclosure 702 of the module 700. Along an opposite side, a stored energy module, shown as battery array 722, is mounted (e.g., due to size and weight distribution considerations). The battery array 722 receives power and is charged by DC current received from the inverter 714, and can be configured to provide current to the power distribution units via the UPS control module 712 as dictated by that module. In certain embodiments, the battery array can include one or more lead acid batteries. Although in various embodiments the amount of battery capacity will vary due to differing needs of a particular data center, in certain embodiments the battery array 722 is capable of delivering 880 kilowatts of power for at least about ten minutes, which will allow either time for either (1) a backup power generator to be activated, or (2) computing systems within the data center to shut down in an orderly fashion, preventing data loss. A battery disconnect 724 allows the battery to be disconnected from the UPS control module 712 and inverter 714, to allow the battery (or portions thereof) to be tested serviced or replaced without being connected to other electronic components.

In alternative embodiments, in place of the battery array 722, alternative stored energy systems could be used, such as a flywheel configuration. Generally, such alternative arrangements will have less energy capacity than the battery array, and as such may be used in the case where less than 10 minutes of full power is required to be delivered. One such circumstance occurs when a data center only wishes to deliver power for an effective bridge to generator power capable of coming online within a shorter period of time (e.g., about 10 seconds).

In use, the electromagnetically shielded power module 700 will receive an electrical supply signal at the input/output component 710. Preferably, since in this embodiment no filter is included in the module, the electrical supply signal is filtered to protect against EMP/IEMI events at a different shielded location (e.g., within a power generation module). The electrical supply signal is passed through and monitored by the UPS control module 712 and converted to DC energy by the inverter 714. The DC energy is used to (1) charge the battery 722, and (2) deliver power to the power distribution units 720*a-b*, through the various switching equipment.

Additionally, a number of supervisory and monitoring components can be included in the electromagnetically shielded power module 700, which allow continual operation with minimal supervision. In the embodiment shown, the electromagnetically shielded power module 700 includes a plurality of control panels mounted to a wall within the enclosure 702, including a fire alarm panel 726, an automation panel 728, a communication panel 730, and a local power panel 732. Although the location of the panels 726-732 is generally a matter of design choice, in the embodiment shown the panels are in a stacked and side-by-side configuration mounted to a wall of the enclosure 702.

The fire alarm panel 726 includes a fire alarm and fire alarm monitor system capable of detecting smoke or fire issues within the module 700. The automation panel 728 provides temperature control and other controls, for example to manage lighting, temperature, and other systems within the module 700. The communication panel 730 can receive data from the fire alarm panel 726 and automation panel 728, and communicate with external systems, thereby allowing management of the module 700 from another module, or offsite altogether. The local power panel 732 provides local power to various low-power equipment and installations within the module 700, such as for lighting and cooling within the module 700.

A plurality of cooling units 734 can be mounted within the electromagnetically shielded power module 700, and act to cool the air in the interior volume 706. Preferably, the cooling units are capable of maintaining an at least ambient room temperature. In the embodiment shown, five cooling units 734 are included; however, more or fewer units could be included in the module 700, depending upon the cooling needs of the module (depending on the circuitry included therein) and the cooling capacity of each cooling unit. One possible cooling unit useable in the module 700 is the CEILAiR ceiling-mounted air conditioning unit manufactured by Stulz Air Technology Systems, Inc. of Frederick, Md. Other cooling unit types can be used as well.

It is noted that, with respect to the electromagnetically shielded power module 700, all input and output electrical signals, air or fluid exchange, or fiber optic signals are expected to be monitored and filtered to prevent incursion of EMP/IEMI signals into the enclosure 702. As discussed above, one or more power filters, waveguides-beyond-cutoff, or seals can be used to isolate the interior volume 706.

Now referring to FIG. 8, a second possible embodiment of an electromagnetically shielded power module 800 is shown, This embodiment generally includes all of the components described above with respect to the module 700 of FIG. 7, but can also be used to directly receive electrical power from one or both of a utility supply or a generator. As such, the module 800 includes a plurality of filters 802*a-c* (generally referred to as power filters 802) positioned at an end of the enclosure 702. A plurality of separate access doors 804 provide access to a filter room separated from the interior volume 706 by a shielded interior wall 806. In such an embodiment, the filter room remains unshielded, with interior wall 806 providing shielding for the interior volume 706 containing the power equipment. The power filters 802*a-c* receive power from various sources, including, for example, a utility power supply, an external generator power supply, and other supplemental power supplies. The power filters 802 are designed to protect against electromagnetic interference in the range of about 14 kHz to about 10 GHz, which covers most EMP/IEMI events.

In this embodiment, filtered power is passed from the filters 802*a-c* into the interior volume 706 of the module 700, to a transfer switch assembly 808, which includes a transfer switch cable compartment 808*a* and a transfer switch 808*b*. The transfer switch 808*b* is configured to switch among the various electrical power sources to ensure a constant supply of AC power to the UPS equipment and other power equipment described above. Generally, the transfer switch 808 is located in a position near the filters 802*a-c*. As such, in the embodiment of FIG. 8, both the filters 802*a-c* and the transfer switch 808*b* are included in the power module, while in FIG. 7, it is assumed that the module 700 receives a single filtered power signal (i.e., another module contains a set of filters and a transfer switch, or other analogous equipment).

It is further recognized that, in the module 800 of FIG. 8, at least one of the doors 708 can be relocated to accommodate the filters 802*a-c* at an end of the module; however, in alternative arrangements, the filters can be located along a side of the module, or in other configurations.

FIG. 9 is a top plan view of an electromagnetically shielded power module 900, according to a further possible embodiment of the present disclosure. The module 900 is specifically designed for use in a smaller, lower-capacity installation, such as a small data center. The module 900 therefore generally includes smaller, lower-capacity versions of the equipment discussed above with respect to FIGS. 7-8, and includes additional room for other equipment typically used in a data center, such as cooling and data systems. Relevant differences between the module 900 and those of FIGS. 7-8 are discussed below.

In general, the module 900 includes an electromagnetically shielded enclosure 902 defined by a shell 904 and one or more doors 906 (shown as doors 906*a-c*) cooperating with a number of interior walls and doors (described below) to shield an interior volume 908 against electromagnetic interference, for example EMP/IEMI events. Generally, the enclosure can be constructed using any of the techniques and materials previously described, and can be any of a number of sizes, analogously to those modules described above. In various possible embodiments, the doors 906*a-c* are positioned at locations along the shell 904 to allow either external access or access from another shielded module.

In the embodiment shown, the enclosure includes a pair of interior walls 910*a-b*, which are used to segment the module 900 and shield the interior volume 908. A first interior wall 910*a* separates an unshielded area in which power filters 802 reside from the interior volume 908 in which the power delivery components reside, analogously to the interior wall 806 of FIG. 8. A plurality of filter doors 909 provide access to the power filters 802 for maintenance and monitoring, and the filters 802 are mounted to the interior wall 910*a* to pass filtered power into the interior volume 908.

The second interior wall 910*b* includes an interior door 911, and along with a portion of the shell 904 and at least one exterior door 906*a* defines a sally port 912. The sally port 912 prevents exposure of the electrical equipment within the interior volume 908 to electromagnetic events by preventing a door to an outside environment to be opened that would expose the portion of the interior volume 908 including electronic equipment to electromagnetic events. For example, an electronic lock system can be implemented in which only one of the exterior door 906*a* and interior door 911 can be opened at once. Such a sally port 912 can be integrated in case entry into the module 900 is not controlled within another shielded enclosure, for example when the module 900 is used as a small, standalone data center. Other exterior doors (e.g., doors 906*b-c* can be used to access the interior volume 908 either from an outside environment (e.g., for emergency entry/exit) or from another shielded module or protected vestibule.

Generally, the module 900 is designed to support a hybrid arrangement in which both power delivery and computing equipment are supported. In this arrangement, all of the equipment within the interior volume 908 is positioned approximately along a center line down the length of the interior volume 908, forming first and second passageways 914*a-b*. This allows user access to both sides of the power delivery and computing equipment. Additionally, the first and second passageways 914*a-b* as illustrated generally result in formation of a cooled passageway 914*a* designed to receive cooled air from cooling equipment, and a hot passageway 914*b*, which receives warmed air resulting from passing through the computing equipment. In the embodiment shown, the passageways 914*a-b* and doors 906*a-c* and interior door 911 are formulated to allow a user to enter and exit the cool passageway 914*a*, while rarely being required to access the hot passageway 914*b*, except for example in the case of maintenance or replacement of equipment.

In one possible embodiment, a barrier 916 is included in the interior volume 908, and is constructed to provide an at least partial barrier between the cool passageway 914*a* and the hot passageway 914*b*. In one possible embodiment, the barrier 916 can be a freezer curtain constructed from a plurality of strips of heavy plastic, each of which are hung from a ceiling of the enclosure 902 and assist in maintaining the temperature differential between the hot and cool passageways 910*a-b*.

Within the interior volume 908, the module 900 includes UPS equipment 912, which provides analogous functionality to the input/output component 710, UPS control module 712, inverter 714, static switch 716, bypass switches 718*a-b*, battery array 722, and battery disconnect 724 of FIGS. 7-8. However, due to the lower power requirements of a power module designed for a smaller installation, this equipment can be more compact, and the battery capacity lessened. In one example embodiment, the UPS equipment 912 is selected to provide about 275 kW of power for approximately 10 minutes, as compared to the 880 kW of power provided by modules 700, 800.

The module 900 also includes a plurality of computing systems 914 and cooling systems 916 arranged in line with the UPS equipment 912. In general the computing systems 914 are rack-sized computing systems that typically each consume 4-8 kW of power and generate substantial heat due to operation, expelled into the hot passageway 910*b*. The cooling systems 916 are configured to draw hot air in from the hot passageway 910*b*, cool the air (e.g., through use of various refrigeration techniques), and expel the cooled air into the cool passageway 910*a*.

A series of control panels are positioned in the cool passageway 910*a* for simple user access, and can include, for example a fire alarm panel 726, an automation panel 728, a communication panel 730, and a local power panel 732, as described above.

Referring now to FIGS. 7-9 generally, it is recognized that, although the electromagnetically shielded power modules described herein illustrate a possible arrangement of power monitoring and distribution components, other components could be included as well, and the components described herein could be reordered or reorganized depending upon the particular application or power requirements of the data center or other installation in which the power module is installed. Additionally, although a particular arrangement and number of modules are described herein, it is recognized that a data center installation can include one or more than one such modules, depending upon power delivery requirements. However, within each module, sufficient redundancy is incorporated to prevent systemwide failure in case one such component fails.

Still referring to the power modules described herein, it is recognized that use of the electromagnetically shielded power modules provides a number of advantages in accordance with the present disclosure. The power modules, according to various embodiments, are designed to both filter input power, as well as to supplement a power supply for a limited amount of time if power delivery to the data center is interrupted for any reason, including in the case of EMP/IEMI events. Therefore, in the case of such events, the power modules of the present disclosure can be used to preserve operation of a data center through occurrence of an event that would otherwise cause damage to electrical components. The power modules can be added one by one, as needed, to a data center or other installation, to provide a protected power system controller protected from electromagnetic event damage.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. An electromagnetically shielded power module comprising:
 (a) an electromagnetically shielded enclosure including a shell and at least one door, the enclosure surrounding and providing electromagnetic shielding for an interior volume;
 (b) a power delivery control module positioned within the interior volume and configured to monitor filtered power received into the interior volume of the electromagnetically shielded enclosure;
 (c) a plurality of power distribution units positioned within the interior volume and configured to receive the filtered power from the power delivery control module and route power to one or more computing systems; and
 (d) a stored energy system positioned within the interior volume and configured to deliver energy to the power distribution unit upon detection of an interruption of filtered power to the power delivery control module.

2. The electromagnetically shielded power module of claim 1, wherein the power delivery control module includes an input/output module configured to receive filtered power.

3. The electromagnetically shielded power module of claim 2, wherein the power delivery control module includes a UPS control module configured to receive a power signal from the input/output module.

4. The electromagnetically shielded power module of claim 3, wherein the power delivery control module includes an inverter configured to receive filtered power from the UPS control module.

5. The electromagnetically shielded power module of claim 1, wherein the stored energy system comprises a battery array.

6. The electromagnetically shielded power module of claim 5, wherein the battery array stores sufficient energy such that, upon an interruption of filtered power, the battery array can deliver at least about 800 kW of energy for at least about 10 minutes.

7. The electromagnetically shielded power module of claim 5, wherein the battery array stores sufficient energy such that, upon an interruption of filtered power, the battery array can deliver at least about 275 kW of energy for at least about 10 minutes.

8. The electromagnetically shielded power module of claim 5, further comprising a battery disconnect system capable of disconnecting the battery array from the power delivery control module.

9. The electromagnetically shielded power module of claim 1, wherein the stored energy system comprises a stored energy flywheel device.

10. The electromagnetically shielded power module of claim 1, wherein the power delivery control module and the plurality of power distribution units are positioned along a side of the enclosure opposite the stored energy system.

11. The electromagnetically shielded power module of claim 1, further comprising a plurality of filters positioned along a side of the enclosure, the plurality of filters configured to receive a power signal and filter electromagnetic interference having signal frequencies of approximately 14 kHz to approximately 10 GHz to provide filtered power.

12. The electromagnetically shielded power module of claim 1, wherein the electromagnetically shielded enclosure provides attenuation of electromagnetic signals of at least about 80 dB.

13. The electromagnetically shielded power module of claim 1, wherein the enclosure is sized to allow human entry and automotive transport.

14. The electromagnetically shielded power module of claim 1, wherein the enclosure is equal to or less than about twelve feet wide, and equal to or less than about 49 feet long.

15. The electromagnetically shielded power module of claim 1, further comprising a plurality of user control panels mounted to a wall of the enclosure.

16. The electromagnetically shielded power module of claim 1, wherein each of the plurality of power distribution units includes a transformer configured to provide power in a form useable by computing systems.

17. The electromagnetically shielded power module of claim 1, wherein the at least one door is an exterior door and includes an environmental gasket.

18. A data center comprising:
 a plurality of interconnected electromagnetically shielded modules including at least one power module, the power module comprising:
  an electromagnetically shielded enclosure including a shell and at least one door, the enclosure surrounding and providing electromagnetic shielding for an interior volume;
  a power delivery control module positioned within the interior volume and configured to monitor filtered power received into the interior volume of the electromagnetically shielded enclosure;

a plurality of power distribution units positioned within the interior volume and configured to receive the filtered power from the power delivery control module and route power to one or more computing systems; and a stored energy system positioned within the interior volume and configured to deliver energy to the power distribution unit upon detection of an interruption of filtered power to the power delivery control module.

19. The data center of claim 18, further comprising a data module containing a plurality of computing systems, wherein the plurality of power distribution units are configured to route power to the plurality of computing systems.

20. The data center of claim 18, wherein the power module further includes a plurality of computing systems included within the interior volume.

21. The data center of claim 20, wherein the computing systems, the power delivery control module, the power distribution units, and the stored energy system are positioned approximately along a center line of the enclosure, thereby forming first and second passageways.

22. The data center of claim 21, further comprising cooling systems positioned approximately along the center line alongside the computing systems, the power delivery control module, the power distribution units, and the stored energy system, the cooling systems configured to receive hot air expelled from the computing systems into the first passageway and return cooled air to the second passageway.

* * * * *